(12) United States Patent
Patel et al.

(10) Patent No.: US 6,664,883 B2
(45) Date of Patent: Dec. 16, 2003

(54) APPARATUS AND METHOD FOR PCB WINDING PLANAR MAGNETIC DEVICES

(75) Inventors: Raoji A. Patel, Framingham, MA (US); James E. Drew, North Chelmsford, MA (US); Raymond A. Pelletier, Goffstown, NH (US); Brian R. McQuain, Sterling, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 30 days.

(21) Appl. No.: 10/167,944

(22) Filed: Jun. 11, 2002

(65) Prior Publication Data

US 2002/0149461 A1 Oct. 17, 2002

Related U.S. Application Data

(62) Division of application No. 09/496,150, filed on Feb. 1, 2000, now Pat. No. 6,429,763.

(51) Int. Cl.$^7$ ................................................. H01F 5/00
(52) U.S. Cl. ....................... 336/200; 336/180; 336/232; 29/602.1
(58) Field of Search .................... 336/65, 83, 180–183, 336/200, 206–208, 220–222, 232; 29/602.1, 603.23, 603.24, 605, 606

(56) References Cited

U.S. PATENT DOCUMENTS

| 5,010,314 | A | * | 4/1991 | Estrov ........................ 336/198 |
| 5,184,103 | A | * | 2/1993 | Gadreau et al. .......... 336/84 C |
| 5,949,321 | A | | 9/1999 | Grandmont et al. ........ 336/232 |
| 5,952,909 | A | | 9/1999 | Umeno et al. .............. 336/192 |
| 6,023,214 | A | * | 2/2000 | Ohta et al. ................ 336/84 R |
| 6,420,953 | B1 | * | 7/2002 | Dadafshar ................... 336/200 |

* cited by examiner

Primary Examiner—Tuyen T. Nguyen

(57) ABSTRACT

A method and apparatus to layout planar magnetic coils on a PCB consists of maximizing the layer to layer overlap, and consequently maximizing total inductance for the given layout area, by spiraling alternating layers inward and outward. A further benefit of the matching opposite spirals is the ability to make the layer to layer electrical contacts within the magnetic field area, thus reducing leakage inductance, and minimizing the wasted extra conductor line length needed to make the connections outside the magnetic field. The reduced conductor line length results in reduced conductor line resistance. The method is applicable to voltage transformers and isolation transformers as well as simple inductors and other magnetic devices. In the transformer case the odd numbered layers are typically connected together in series to provide a larger turn ratio, and the even numbered layers are typically single turns (i.e., no spiral) connected together in parallel to provide more current capability.

3 Claims, 9 Drawing Sheets

APPARATUS AND METHOD FOR PCB WINDING PLANAR MAGNETIC DEVICES

RELATED APPLICATION(S)

This application is a divisional of U.S. application Ser. No. 09/496,150, filed Feb. 1, 2000, now U.S. Pat. No. 6,429,763. The entire teachings of the above application are incorporated herein by reference.

BACKGROUND OF THE INVENTION

Magnetic devices, such as DC to DC power supplies, isolation transformers, voltage step down transformers, and inductors are needed in various electronic circuits. It is time consuming and difficult to insert discrete packaged transformer and inductor components onto a printed circuit board (i.e., PCB), and the high profile of these parts is not compatible with many types of finished products, such as cell phones, personal digital assistants (i.e., PDAs), and notebook computers. Further, the wave soldered thru hole connections, or the surface mount soldering pads, required for attaching these transformers or inductors to the PCB provide further opportunities for the introduction of fatal manufacturing defects, especially with current PCBs typically having as many as 20 conductive layers.

To solve the discrete component problem for transformers and inductors on PCBs discussed above, it is known to use the various individual conductor layers that comprise a typical PCB to create planar electrical coils through which electrical currents are propagated to create a magnetic field. By stacking such coils, for example one coil per conductor layer of the PCB, one on top of the other, and by connecting the individual coils together by means of what are known as vias in the PCB, it is possible to create stacked inductive coils having reasonably small size and sufficient total inductance values.

By interleaving the coils and separating the electrical connections into two groups, one group, for example the odd numbered layers, as a primary winding, and the second group, for example the even numbered layers, as the secondary winding, then the stacked inductors may be formed into a power transformer. To illustrate the transformer formation with a ten to one step down voltage transformation, the first layer would be a primary ten turn winding, the second layer would be a secondary one turn winding, the third layer would be another primary ten turn winding, and so on through as many of the PCB layers as are desired to achieve the necessary current and magnetic field, or until the last available PCB layer is reached.

However, there is a problem with the planar coils described above. The need to make electrical connections through the insulating layers separating the conductive layers of the PCB disrupts the direction and flow of electrical current and creates what is known as leakage inductance. Leakage inductance reduces the magnetic coupling between windings of the transformer, and increases thermal management problems and consequently reduces component lifetime. The need to make layer to layer contact also results in increased length of the conductor runs, and consequent increased winding resistance, and thus again increased thermal management problems.

Therefore, a problem exists with efficiently making contact between planar coils, and in laying out the coils to maximize the layer to layer overlap, and thus the total inductance, while minimizing the total coil length and the number of contacts outside the magnetic field area.

SUMMARY OF THE INVENTION

An apparatus and method for providing planar magnetic fields for PCB inductance and voltage transformation is presented having a typical PCB with multiple conductive layers electrically separated by insulating layers. A set of primary windings and secondary windings having a specified order are arranged on the layers of the PCB to form the magnetic device. In a preferred embodiment of the invention, a first primary winding is created on a first one of the conductive layers of the PCB, a first secondary winding is created on a second conductive layer of the PCB directly below the first winding. A second primary winding is created on the third conductive layer of the PCB, and a second secondary winding is created on a fourth conductive layer of the PCB, continuing in this fashion until each one of the desired number of primary and secondary windings are created within a PCB.

In another embodiment of the invention, the odd numbered primary windings spiral inward toward a core region in either a clockwise or counter clockwise direction, and the even numbered primary windings spiral outward from the core region in the same direction as the odd numbered primary windings. Also the odd numbered secondary windings spiral inward toward the core region, and the even numbered secondary windings spiral outward from the core region in the same direction as the odd numbered secondary windings. In an alternate embodiment of the invention, the odd numbered secondary windings spiral outward from the core region rather than inward, and the even numbered secondary windings spiral inward.

In a further embodiment of the invention, the number of conductive PCB layers is smaller than the needed number of primary and secondary windings. The remaining number of required windings are created on one or two small multilayered PCBs, which are attached to the surface of the PCB, typically directly above or below the PCB winding, in order to continue the coil stack.

In another embodiment of the invention, all of the electrical connections between coils on different PCB layers are made inside the magnetic field area of the coil stack to reduce leakage inductance.

In yet another embodiment of the invention, the odd numbered ones of the coils are connected together in series to form the primary windings of a transformer, and the even numbered ones are electrically connected together in parallel to form the secondary windings of the transformer. In an alternate embodiment the secondary windings are single turn coils.

A PCB winding technique is presented that minimizes the number and length of layer to layer interconnections, and provides the interconnections inside the magnetic field of a magnetic device built on a PCB. This improves the high parasitic losses found in present planar magnetic winding techniques. The improvement is due to better usage of the area of conductive material (i.e., Copper) inside the magnetic field area since less conductive material is used for layer to layer interconnection. This is accomplished by spiraling the first layer inward towards the magnetic core, then the next interconnected layer down spirals outward away from the core, etc. By making all of the magnetic connections inside the magnetic field area, the usual leakage inductance is minimized, and reducing the overall length of the windings by not leaving the magnetic field area to make connects, the electrical resistance of the winding is reduced, thereby reducing parasitic current loss and unwanted component heating.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

The invention will be described with reference to an illustrative example of a ten to one voltage step down transformer. The specific direction, placement and number of turns of the spiral coils depends upon the device characteristics desired, and the invention is not limited to the specific examples shown, but rather the principles of the invention may be applied to other types of planar coil inductors, transformers and other magnetic devices.

Figure 1:
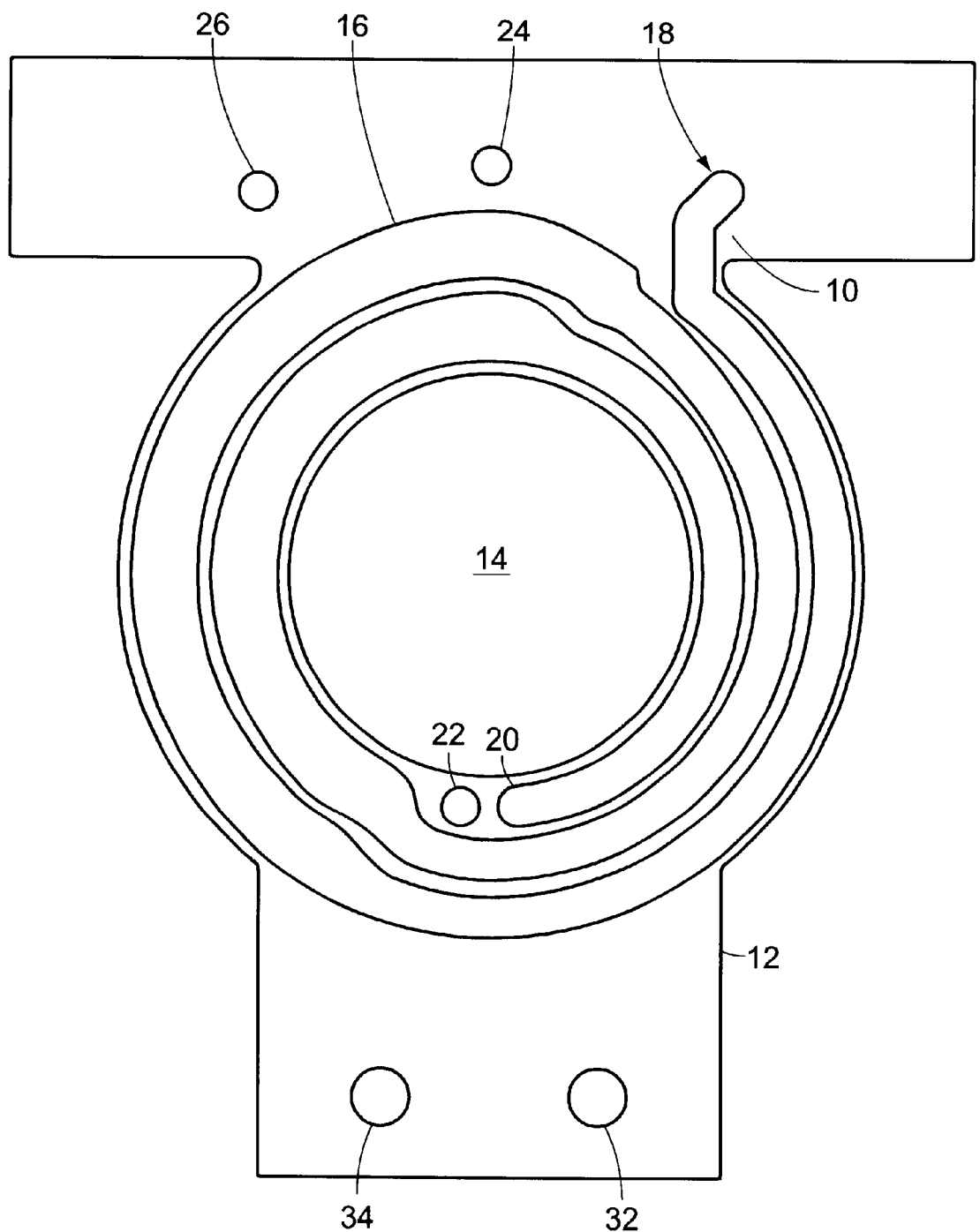
FIG. 1 is a top view of a first conductor layer.

FIG. 1 shows a top view of a first conductor layer 10 disposed typically on the top layer of a PCB 12, or alternatively on the first buried conductor layer inside the PCB. The conductor 10 may be intended for either a magnetic device such as an inductor or for a transformer. In the case of a inductor, all of the various conductor layers such as 10 will be wound having as many turns of the coil as possible on each layer, compatible with the required winding resistance, the PCB spacing requirements and allowable PCB area. To increase the total inductance of an inductor it is possible to insert a ferrite material into the central axis of the coil. In the present preferred illustrative embodiment of the invention, the PCB 12 has a hole 14 (shown with shading) disposed to accept a ferrite core in all of the PCB layers, but this is not a requirement of the invention.

The conductor layer 10 is preferably formed into a coil 16, in this illustrative embodiment of the invention, having a clockwise inward spiral toward the central core 14. The first coil 16 in this example is shown as a first primary winding of an illustrative ten to one voltage step down transformer. The first primary winding, coil 16, shown as having 2.5 turns, has a primary current input at via 18, from an outside current source, not shown. The first primary coil 16 leaves the first conductor layer 10 at via 20, which passes through the PCB 12 second conductive layer without making electrical contact in this illustrative embodiment, and electrically connects to the third conductive layer. Notice that the via 20 is within the magnetic field delineated on the inside by the hole 14 in the PCB 12, and on the outside by the edge of the coil 16. This arrangement reduces what is known as leakage inductance.

Notice that there are unused vias 22, 24, 26, 32 and 34. In PCB manufacturing it is simpler and cheaper to have all vias pass completely through the entire board, and only make contact to those vias that are needed on each layer. This results in a certain amount of wasted space and lost coil to coil area as may be seen by the lost conductor area of coil 16 in the region of via 22. This lost conductor area reduces the total inductance of the coil and maybe at least partly eliminated by the use of what are known as blind vias in the PCB. However blind vias increase the overall PCB cost.

Figure 2:
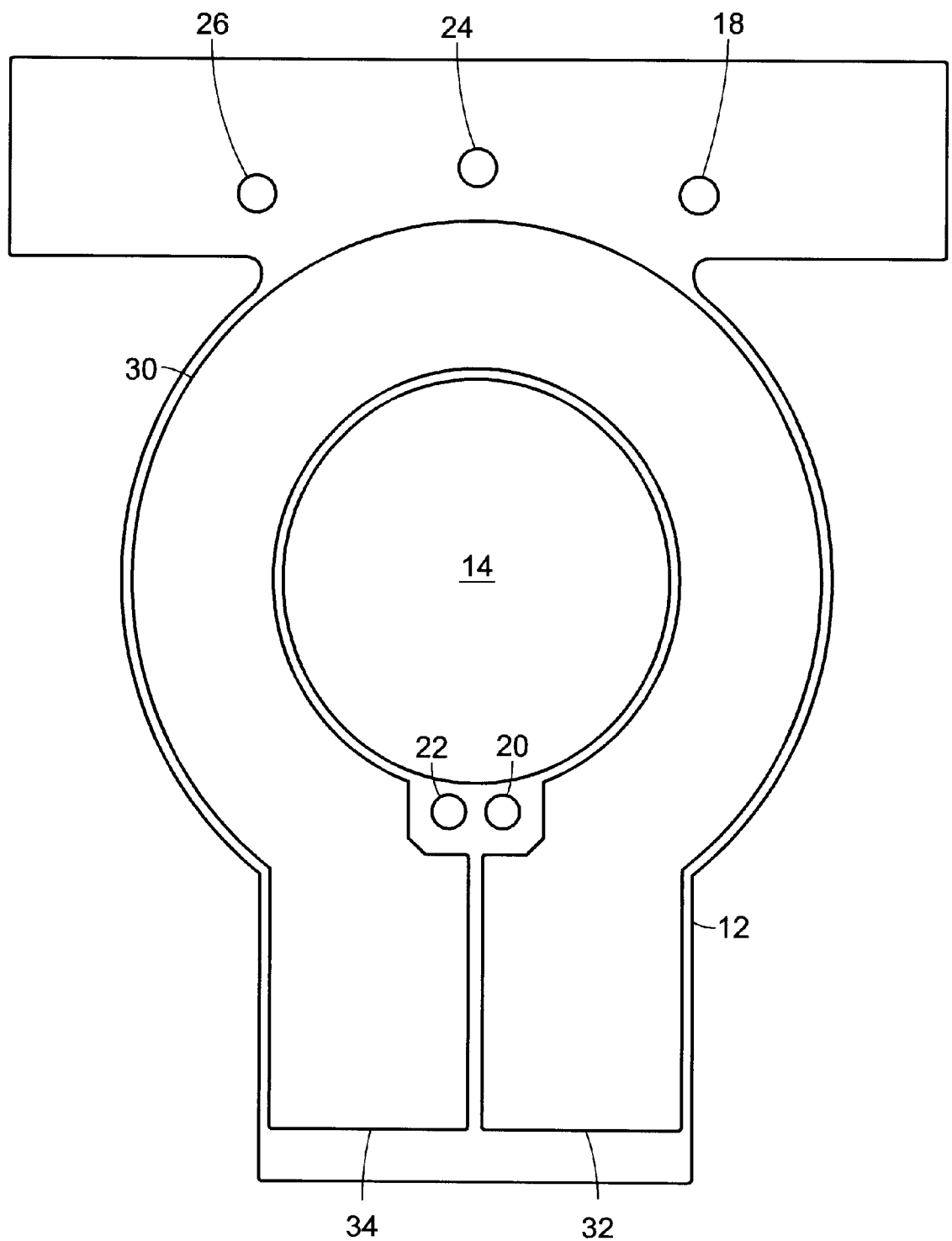
FIG. 2 is a top view of a second conductor layer.

FIG. 2 shows a top view of a second conductor layer 30 on the next lower conductor layer of PCB 12. In this illustrative embodiment of the invention, the second layer 30 is a first secondary winding of a transformer. In this example of a ten to one voltage reduction transformer, the secondary winding 30 is a single turn having an input contact at 32, and an output contact at 34. Since the illustration has only a single turn, there is consequently no spiral, but in an alternative embodiment of a simple inductor, the coil 30 would typically have 2.5 windings in a clockwise direction, as did the first coil 16 in FIG. 1. Notice that the present example has no electrical contact between the second coil 30 and the first coil 16 since the primary and secondary winding of a transformer may not have any direct electrical connection. However, in an alternative embodiment of an inductor, the second coil 30 would typically be connected to the same via 20 as the first coil 16 discussed in the first figure to provide a continuous coil.

Figure 3:
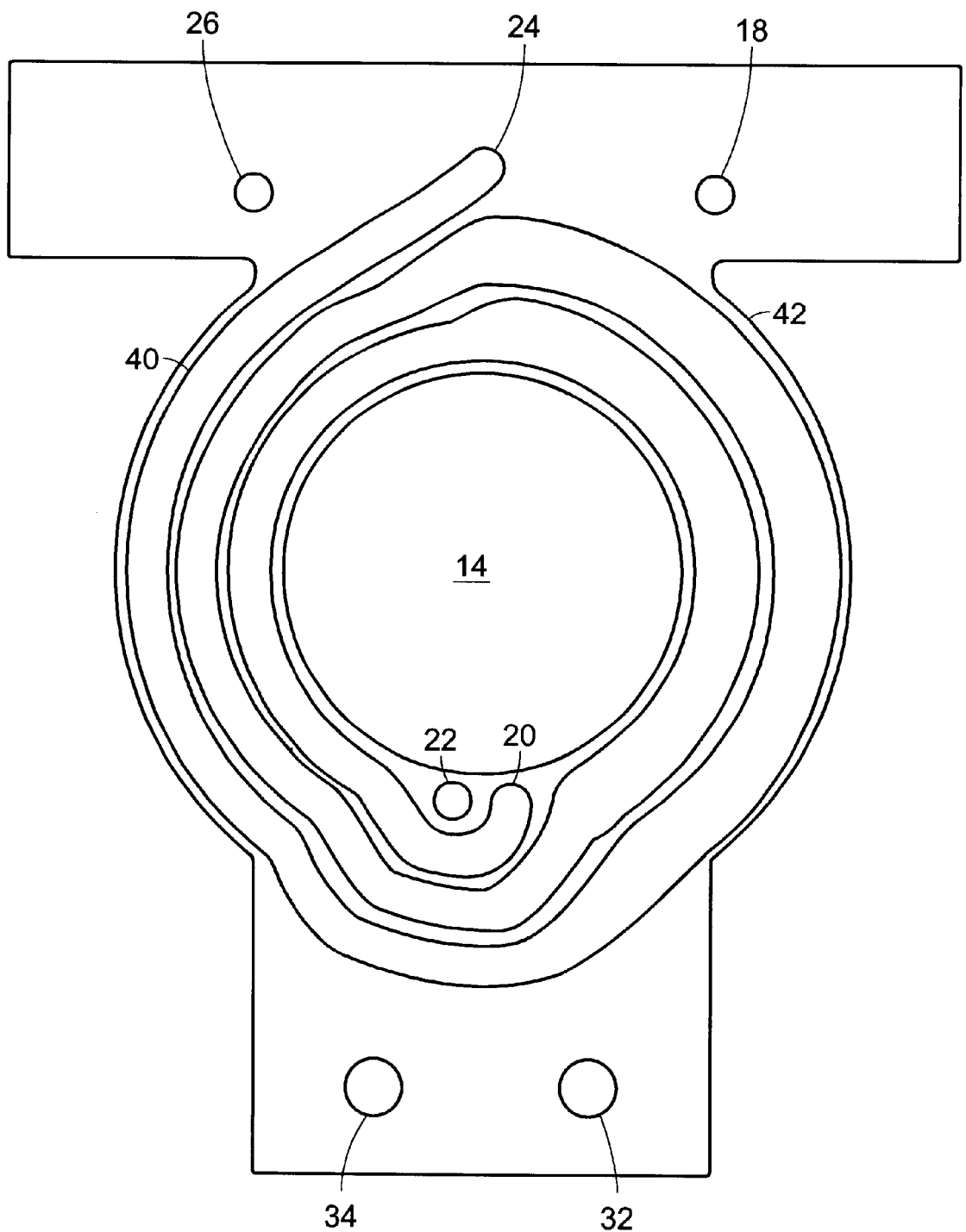
FIG. 3 is a top view of a third conductor layer.

FIG. 3 shows a top view of a second primary coil 40 constructed on a third conductor layer 42. The second primary coil 40 is a 2.5 turn clockwise outward spiral beginning at via 20 and ending at via 24. Notice that the end of the first primary coil 16 of FIG. 1, and the beginning of the second primary coil 40 of FIG. 2, are both at via 20, and thus the coil 40 is connected in series with the coil 16, effectively providing a total of five turns for the primary side of the transformer.

Figure 4:
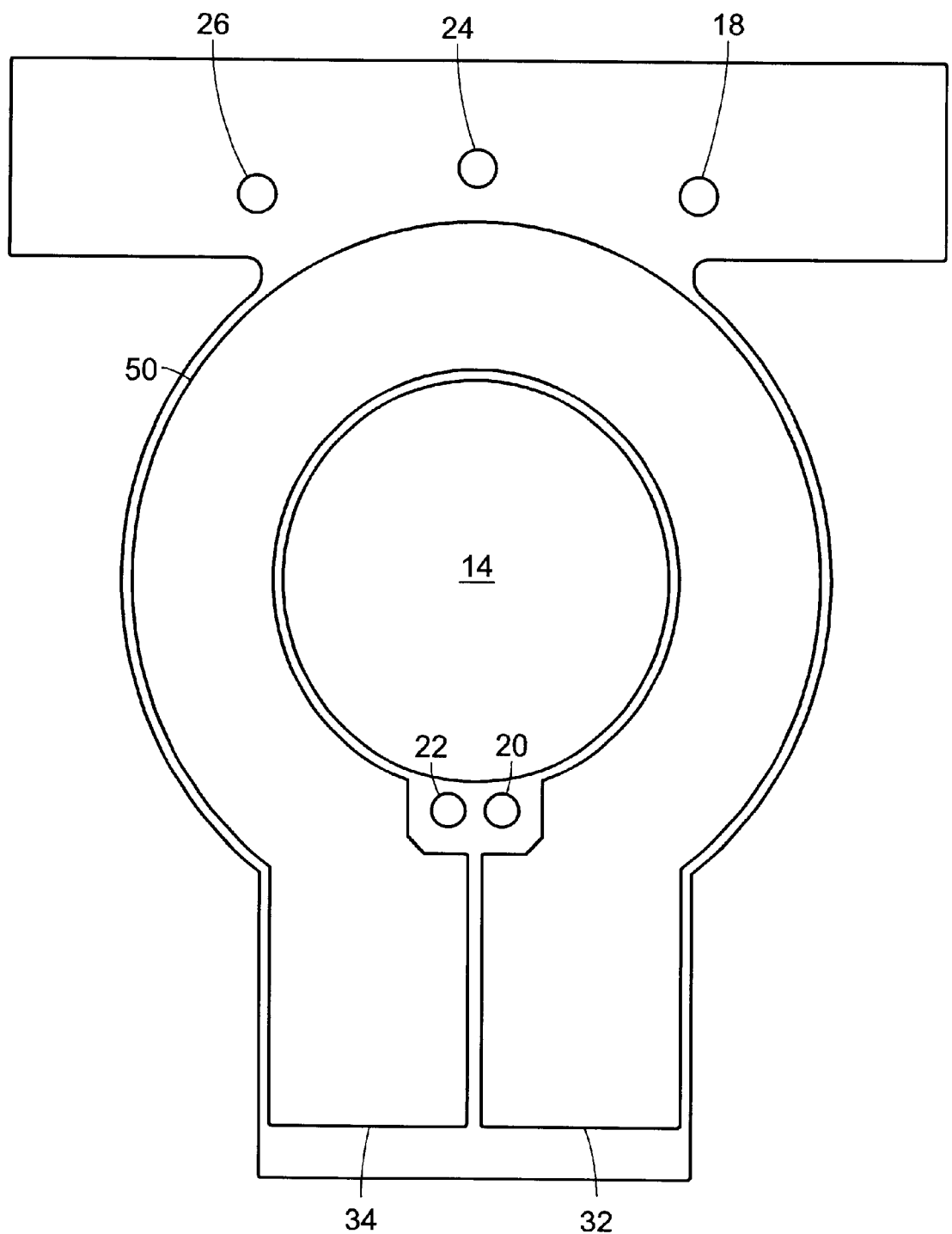
FIG. 4 is a top view of a fourth conductor layer.

FIG. 4 shows a top view of a second secondary coil 50 having an input at 32 and an output at 34. Notice that the first and the second coils 30, 50 of the secondary side of the illustrative transformer are both connected to the same inputs and outputs, and are thus connected in parallel, providing greater current capability on the voltage step down side of the illustrative transformer.

Figure 5:
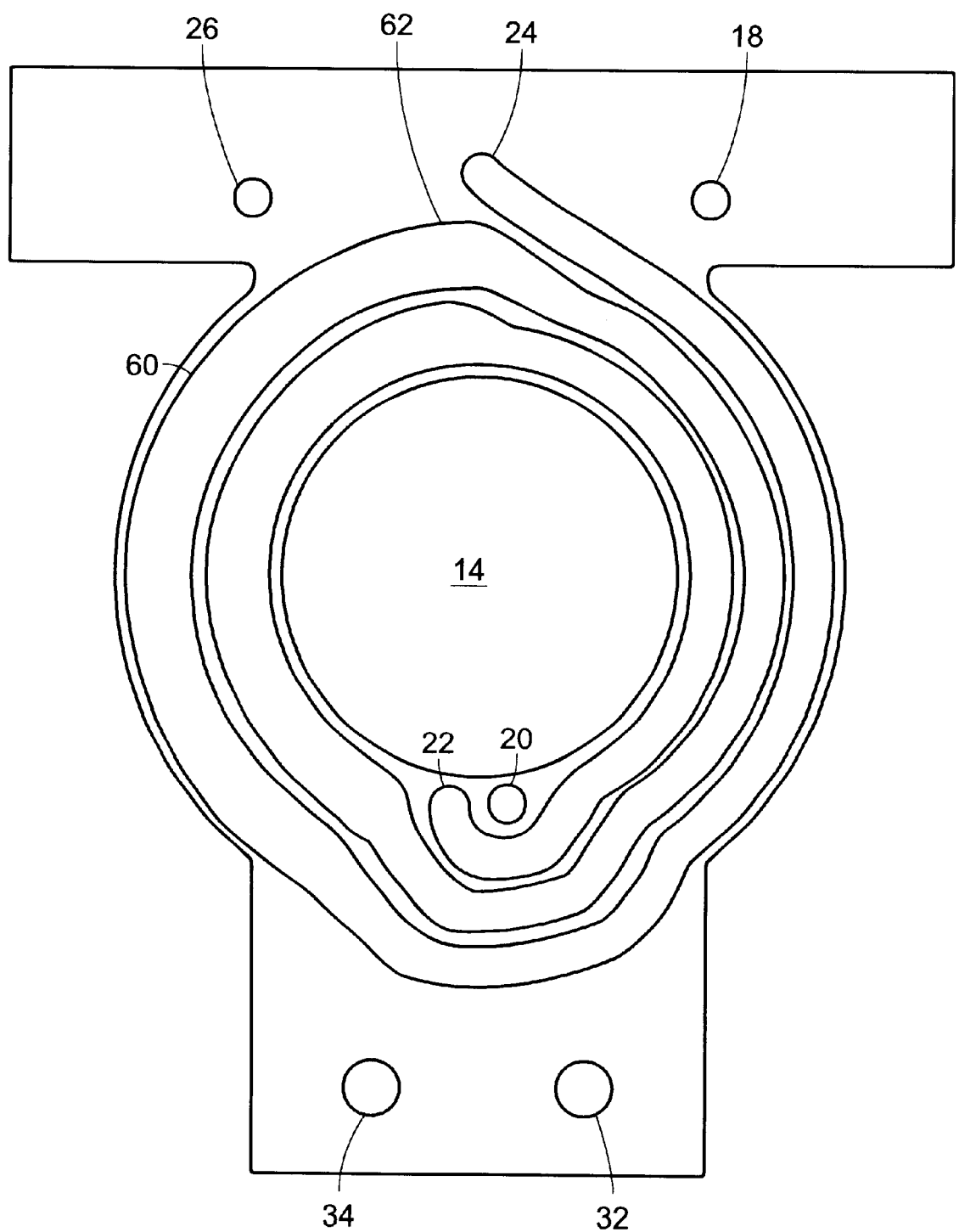
FIG. 5 is a top view of a fifth conductor layer.

FIG. 5 shows a top view of a third primary coil 60, again having 2.5 turns in a clockwise inward spiral, starting from via 24 and ending at via 22. Thus coil 60 starts where the second primary coil 40 ends, and is therefore connected in series with the first and the second primary coils 16, 40 in series, providing 7.5 turns in the primary coil. Notice that the example has the via 24 connecting the second and third primary coils placed a little outside the magnetic field area. This can be easily changed by placing via 24 in a notch in the coil 60 at location 62, however this will result in increased current resistance. The tradeoff must be resolved based upon the specific requirements of each magnetic device in the specific circuit design.

Figure 6:
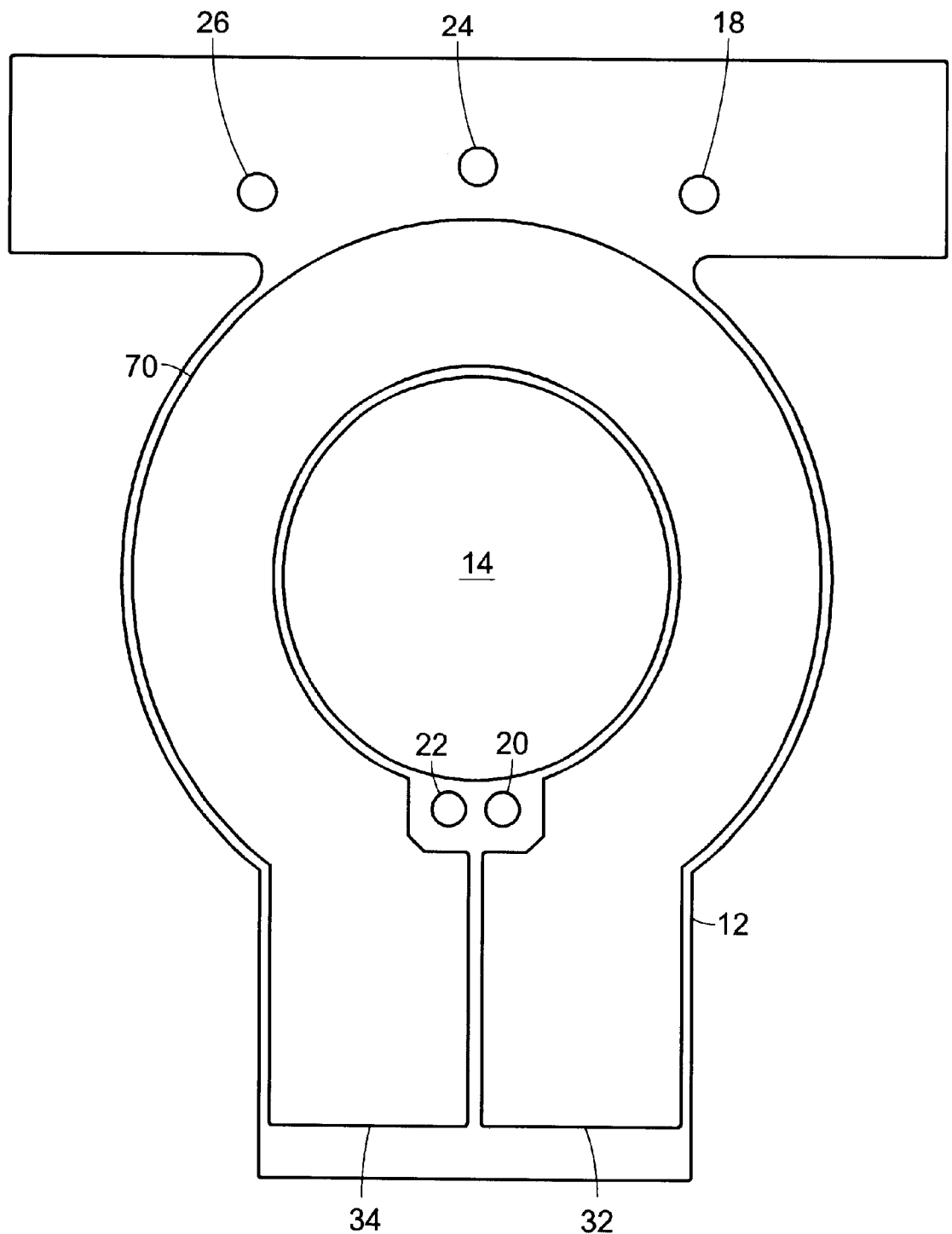
FIG. 6 is a top view of a sixth conductor layer.

FIG. 6 shows a top view of a third secondary coil 70, again having a single turn connected in parallel with the first and second secondary coils 30, 50 at vias 32 and 34. In the illustrative embodiment of this example the parallel connection of the single turn secondary coils 30, 50, 70 result in an effective single turn secondary side of the voltage step down transformer, but having greater current handling capability.

Figure 7:
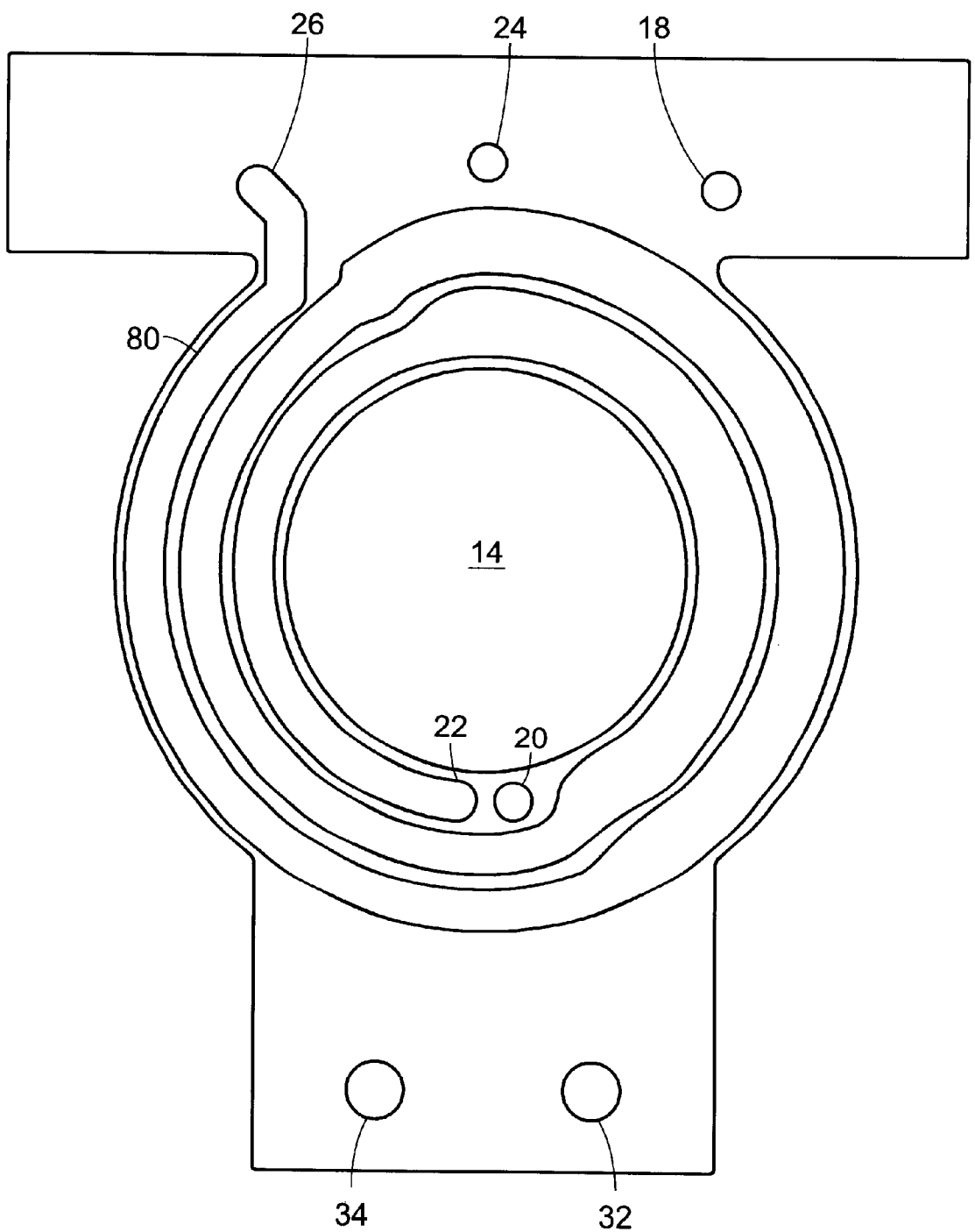
FIG. 7 is a top view of a seventh conductor layer.

FIG. 7 shows a top view of a fourth primary coil 80, again having 2.5 turns spiraling outward in a clockwise direction starting from via 22, where the third primary coil 60 ended, and ending at output via 26. The four coils 16, 40, 60, 80, each having 2.5 turns, connected in series results in a single ten turn primary side to the transformer.

Figure 8:
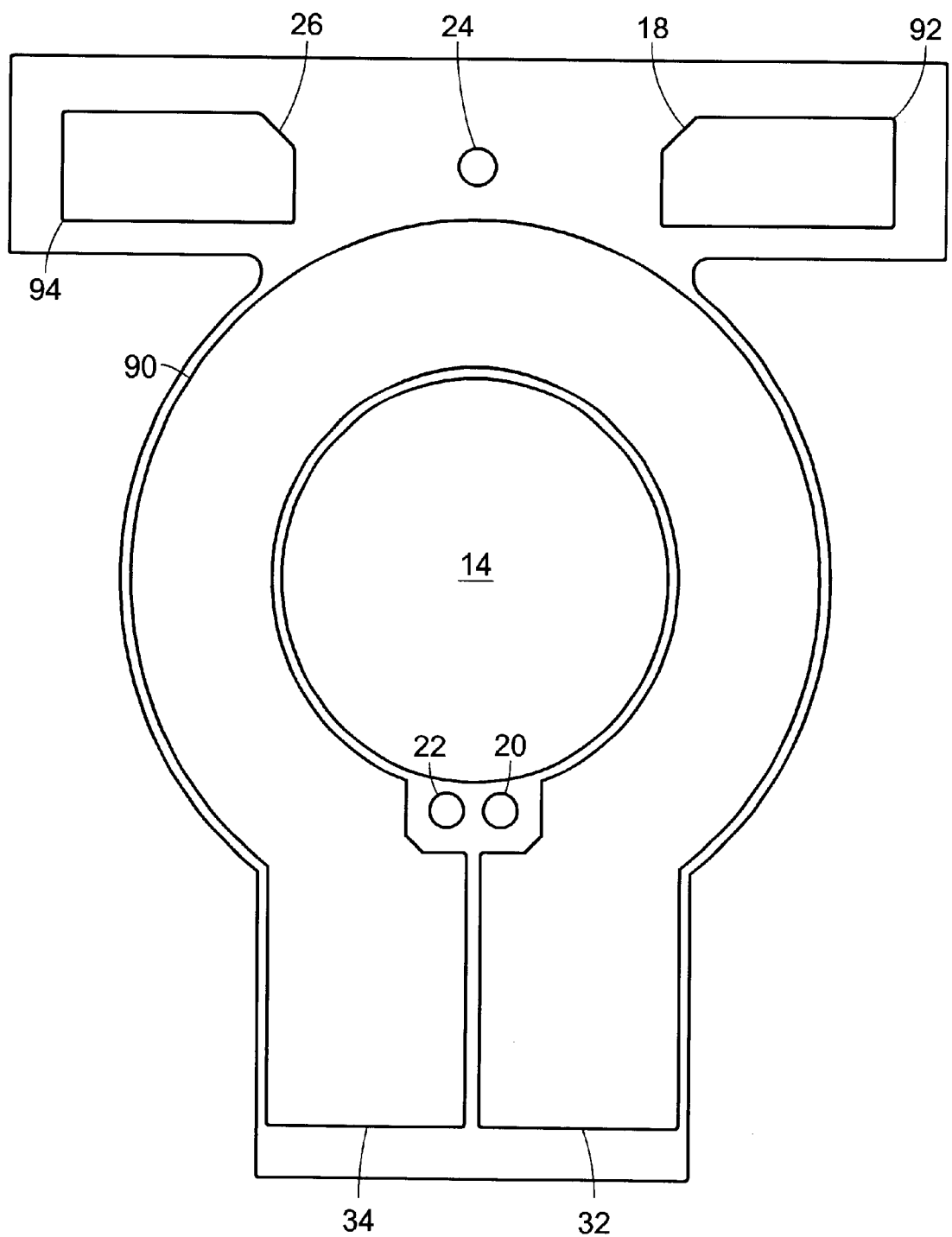
FIG. 8 is a top view of a eighth conductor layer.

FIG. 8 shows a top view of a fourth secondary coil 90 having a single turn and connected to the previous three secondary coils 30, 50, 70 at vias 32 and 34, resulting in a parallel connection and a single turn secondary side to the illustrative transformer having four times the current carrying capability. FIG. 8 also shows primary current input line 92 attached to the primary coil input by via 18, and primary coil current output 94, connected by via 26.

Figure 9:
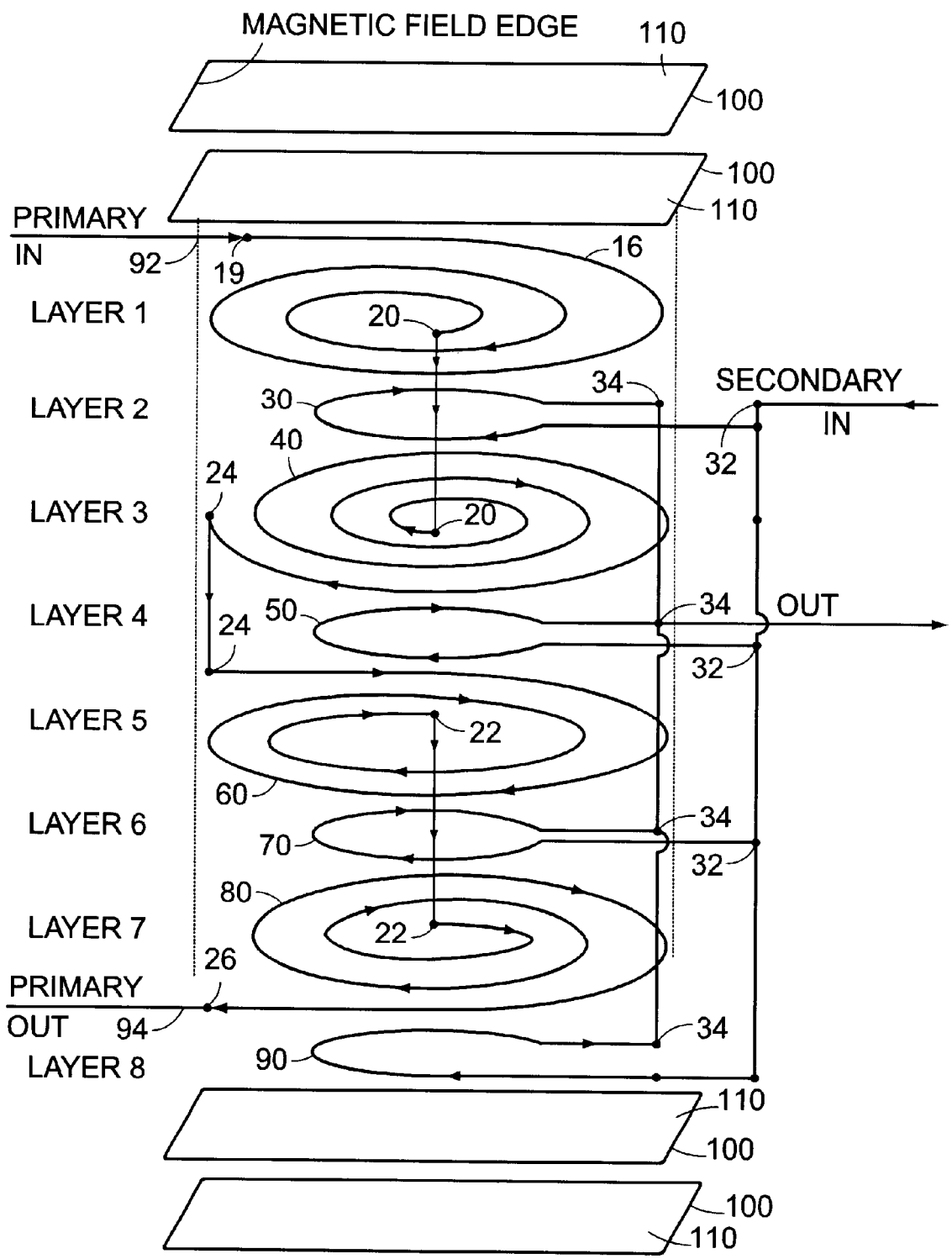
FIG. 9 is a transformer circuit schematic of a preferred embodiment of the invention.

FIG. 9 is a circuit schematic showing all four primary windings 16, 40, 60, 80 and all four secondary windings 30, 50, 70, 90 of the preceding eight figures, with all of the numbering having the same meanings. Following the overall flow of the primary current coils from the main input line 92, to via 18 and through 2.5 inward clockwise spiraling turns on first primary coil 16 to via 20 past the second layer 30 and connecting to the third layer, which is the second primary coil 40. Coil 40 spirals outward 2.5 turns in a clockwise direction to via 24, and hence bypassing layer 4 to connect in series with layer 5, the third primary coil 60, which spirals clock wise inward to via 22. Via 22 leads past layer 6 and connects to coil 80 on layer 7, the fourth primary coil in the illustrative transformer. Coil 80 again spirals clockwise out with 2.5 turns and ends at via 26, which leads to the primary coil output at line 94. This results in ten total coil turns, and is the primary coil in the illustrative ten to one voltage set down transformer. The secondary coil is more easily seen since all four single turn coils 30, 50, 70 and 90 connect to the input line at via 32, and output line at via 34. This results in an effective single turn coil for the secondary side of the transformer.

The alternating inward and outward spirals of adjacent coils results in the maximum possible coil to coil overlap and improved mutual inductance. The illustration uses a clockwise direction to the spirals, but either direction is acceptable as long as all spirals are in the same direction to maximize overlap. The alternation of inward with outward spirals results in the shortest possible coil to coil interconnection distance, and consequently the minimum leakage inductance and winding resistance. Generally it is likely that the first coil will spiral inward and the last coil will spiral outward in order to shorten the input and output lead lengths, but this is not a requirement of the invention.

From the above description of a preferred embodiment of a transformer, it is simple to see the application of the invention to a simple inductor. In the case of an inductor the coils would all be connected directly together in either the series connection shown for the primary side of the transformer, or in parallel as shown for the secondary side of the transformer, depending upon the design requirements for larger inductance or for larger current carrying capability.

While this invention has been particularly shown and described with references to preferred embodiments thereof, it will be understood by those skilled in the art that various changes in form and details may be made therein without departing from the scope of the invention encompassed by the appended claims.

For example, since the number of coils is ordinarily limited by the number of PCB layers available, if additional coils are required by the specific design, an alternate embodiment of the invention increases the available number of coils by attaching small daughter boards 100 of about the maximum dimension of the coils either above, or below, or both, of the coils already on the PCB. Each daughter board 100 has at least one conductive layer 110. In this fashion the number of available coil layers is increased without having to utilize more expensive multilayer PCBs. The area of the PCB around the outside of the coils, and in the center of the coils may be cut away, and the inductance increased by the addition of a ferrite core in the center, and magnetic return fittings connecting the ends of the ferrite core may pass through the cut away outside portions.

What is claimed is:

1. A method for winding conductors for providing magnetic fields on a PCB having a plurality of conductive layers, comprising the steps of:

winding a first coil having an inward clockwise spiral with a specified number of turns toward a central core on a first conductive layer of the PCB, terminating the inward spiral at an electrical via connection passing through a second conductive layer without making electrical contact, and making electrical contact to a third conductive layer;

winding a second coil having a single turn on the second conductive layer of the PCB, and terminating the winding at an electrical via passing through the third layer without making electrical contact, and making electrical contact to a fourth conductive layer of the PCB;

winding a third coil having an outward clockwise spiral with a specified number of turns away from the central core on an area of the third conductive layer of the PCB which is disposed to be directly underneath the location of the first coil; and winding a fourth coil having a single turn on the fourth conductive layer of the PCB on an area of the fourth conductive layer that is disposed to be directly underneath the second coil.

2. The method of claim 1 wherein the first and third coils are connected in series, the second and fourth coils are connected in parallel, and all of the coil to coil via connections are within the magnetic field area of the coils.

3. The method of claim 2 wherein further there are a plurality of pairs of coils disposed similarly directly below, and connected in series to, the first and third coils; and a plurality of pairs of coils disposed similarly directly below, and connected in parallel to the second and fourth coils.

* * * * *